US011545975B2

(12) United States Patent
Lee et al.

(10) Patent No.: US 11,545,975 B2
(45) Date of Patent: Jan. 3, 2023

(54) MECHANICAL BUTTON APPARATUS

(71) Applicant: Korea Electronics Technology Institute, Seongnam-si (KR)

(72) Inventors: Sang Yub Lee, Seongnam-si (KR); Jae Kyu Lee, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 191 days.

(21) Appl. No.: 17/129,090

(22) Filed: Dec. 21, 2020

(65) Prior Publication Data

US 2021/0257169 A1 Aug. 19, 2021

(30) Foreign Application Priority Data

Feb. 11, 2020 (KR) ........................ 10-2020-0016227

(51) Int. Cl.
*G06F 1/3234* (2019.01)
*G06F 1/3231* (2019.01)
*G06F 3/0362* (2013.01)
*H03K 17/95* (2006.01)
*H03K 17/97* (2006.01)
(Continued)

(52) U.S. Cl.
CPC ............ *H03K 17/95* (2013.01); *B60K 35/00* (2013.01); *G06F 1/3231* (2013.01); *G06F 1/3265* (2013.01); *G06F 3/0362* (2013.01); *H02S 40/20* (2014.12); *H02S 40/38* (2014.12); *H03K 17/97* (2013.01); *B60K 2370/152* (2019.05); *B60K 2370/682* (2019.05); *B60K 2370/691* (2019.05); *B60K 2370/693* (2019.05)

(58) Field of Classification Search
None
See application file for complete search history.

(56) References Cited

U.S. PATENT DOCUMENTS

2007/0131852 A1\* 6/2007 Welch ................. G01D 11/245
250/231.13
2008/0304126 A1\* 12/2008 Powell .................... G01J 5/084
359/227

(Continued)

FOREIGN PATENT DOCUMENTS

JP 2009-216888 A 9/2009
KR 10-2016-0037688 A 4/2016

*Primary Examiner* — Matthew Yeung
(74) *Attorney, Agent, or Firm* — Knobbe, Martens, Olson & Bear, LLP

(57) ABSTRACT

This application relates to a mechanical button apparatus that includes a body where an upper portion thereof is closed and a lower portion thereof is opened and a bottom plate attached on a display screen of a display apparatus to cover the opened lower portion. The body includes an aperture member including a wing set expanded or contracted in a rotation direction of the body. The body also includes a photovoltaic (PV) cell array substrate including a PV cell configured to generate power for charging a battery and an optical sensor configured to convert light signals, reflected by the expanded or contracted wing set, into electrical signals. The body further includes a circuit substrate configured to operate with the power charged into the battery, calculate number of rotation manipulations of the body by using the electrical signals, and transmit the calculated number of rotation manipulations to the display apparatus.

8 Claims, 8 Drawing Sheets

(51) Int. Cl.
*B60K 35/00* (2006.01)
*H02S 40/20* (2014.01)
*H02S 40/38* (2014.01)

(56) References Cited

U.S. PATENT DOCUMENTS

| | | | | |
|---|---|---|---|---|
| 2012/0055763 A1* | 3/2012 | Chou | ................... | H01H 25/065 |
| | | | | 200/4 |
| 2013/0220779 A1* | 8/2013 | Kerner | ................... | H01H 25/06 |
| | | | | 200/4 |
| 2020/0122575 A1* | 4/2020 | Chion | ................... | B60K 35/00 |

* cited by examiner

MECHANICAL BUTTON APPARATUS

CROSS-REFERENCE TO RELATED APPLICATIONS

This application claims priority under 35 U. S. C. 119 to Korean Patent Application No 10-2020-0016227, filed on Feb. 11, 2020, the disclosure of which is incorporated herein by reference in its entirety.

TECHNICAL FIELD

The described technology relates to an in-vehicle mechanical button, and more particularly, to a method which enhances the convenience of a user by controlling a mechanical button (for example, a jog shuttle) based on sensing of a magnetic field and is applicable to large displays.

SUMMARY

One aspect provides an apparatus and a method, which enable application of a mechanical button attachable on a display apparatus without changing the display apparatus.

Another aspect provides a method which maintains a source power at a low power level on the basis of a characteristic of a display continuously emitting light by using a photovoltaic module.

Another aspect provides a method which senses a selection or not of a user with a low power by using a magnetic field scheme, and thus, enables a user to easily perform desired manipulation.

In one general aspect, a mechanical button apparatus including: a body where an upper portion thereof is closed and a lower portion thereof is opened; and a bottom plate attached on a display screen of a display apparatus to cover the opened lower portion, wherein the body includes: an aperture member including a wing set expanded or contracted in a rotation direction of the body; a photovoltaic (PV) cell array substrate including a PV cell configured to generate power for charging a battery and an optical sensor configured to convert light signals, reflected by the expanded or contracted wing set, into electrical signals; and a circuit substrate configured to operate with the power charged into the battery, calculate number of rotation manipulations of the body by using the electrical signals, and transmit the calculated number of rotation manipulations to the display apparatus.

In another general aspect, a mechanical button apparatus including: a body where an upper portion thereof is closed and a lower portion thereof is opened; and a bottom plate attached on a display screen of a display apparatus to cover the opened lower portion, wherein the body includes: an aperture member including a wing set expanded or contracted in a rotation direction of the body; a photovoltaic (PV) cell array substrate including a PV cell configured to generate power for charging a battery and an optical sensor configured to convert light signals, reflected by the expanded or contracted wing set, into electrical signals; a magnetic field sensor configured to sense approach or contact of a finger of a user; and a circuit substrate including a plurality of modules configured to calculate number of rotation manipulations of the body by using the electrical signals and to perform data processing for transmitting the calculated number of rotation manipulations to the display apparatus and a power supply configured to, when the approach of the finger is sensed, supply some of the plurality of modules with the power charged into the battery and when the contact of the finger is sensed, supply the other modules with the power charged into the battery.

Other features and aspects will be apparent from the following detailed description, the drawings, and the claims.

DETAILED DESCRIPTION

Figure 1:
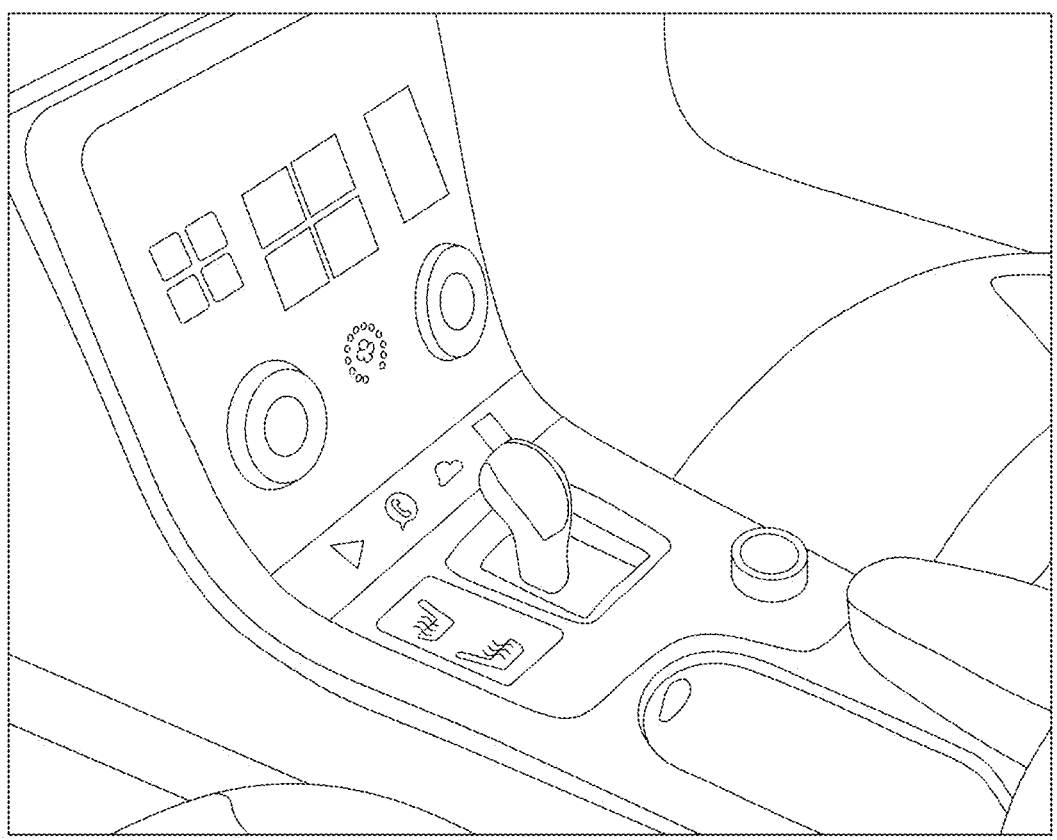
FIGS. 1 and 2 are photograph images showing an example of an in-vehicle display apparatus.
Figure 2:
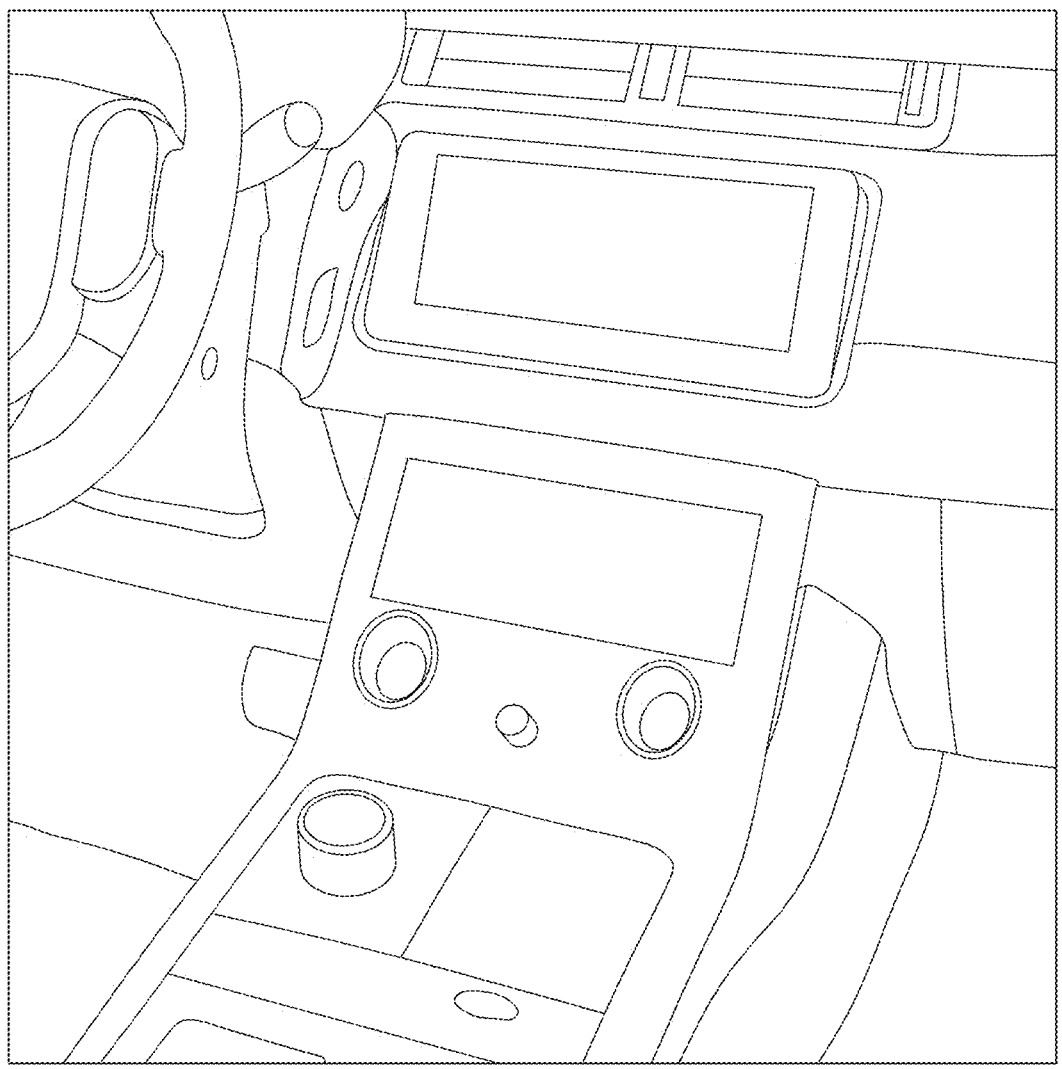

FIGS. 1 and 2 are photograph images showing an example of an in-vehicle vehicle display apparatus.

As illustrated in FIGS. 1 and 2, as the number of display apparatuses in vehicles increases, various systems where a mechanical button and a display for securing a response of a user are combined are being developed.

In order to simultaneously apply a mechanical button and a display, a separate display apparatus should be manufactured, and the manufacturing cost is much expended.

Moreover, in a case where a button of each vehicle is changed or a position thereof is changed, there is a problem where a corresponding display should be manufactured again.

Since the described technology may have diverse modified embodiments, preferred embodiments are illustrated in the drawings and are described in the detailed description of the described technology. However, this does not limit the described technology within specific embodiments and it should be understood that the described technology covers all the modifications, equivalents, and replacements within the idea and technical scope of the described technology.

In the following description, the technical terms are used only for explain a specific exemplary embodiment while not limiting the described technology. The terms of a singular form may include plural forms unless referred to the contrary. The meaning of 'comprise', 'include', or 'have' specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to accomplish the above-described objects and effects, the described technology may propose a mechanical button (for example, a jog shuttle) which may be controlled with being attached on a display apparatus.

Particularly, a button apparatus manufactured as an attachable type may be driven with a low power and may need to use power in performing only a minimum operation.

Moreover, the mechanical button apparatus according to the described technology may be driven at a free position in connection with a user interface (UI) regardless of an attached position in terms of a characteristic of a display.

Moreover, the mechanical button apparatus according to the described technology may previously determine an attempt to perform manipulation of a user by using a magnetic field sensor and may be driven in a wakeup mode, and when woken up, may secondarily sense whether the user directly selects a button, by using a second magnetic field sensor.

Moreover, in a case where the described technology is implemented as a button type, a selected value may be transferred through Bluetooth on the basis of the degree of sensing. In this case, Bluetooth may assign authority by using a multi-pairing function in a state where various buttons are simultaneously accessible and manipulatable.

Particularly, in order to maintain a power of a mechanical button according to the described technology, power may be maintained by a small photovoltaic module by using a normal light emitting function of a display.

Hereinafter, a mechanical button apparatus based on sensing of a magnetic field according to embodiments of the described technology will be described in detail.

The mechanical button apparatus based on sensing of a magnetic field according to embodiments of the described technology may be configured so that the mechanical button apparatus is attached on a display apparatus and a display screen of the display apparatus and cooperates with a UI displayed on the display screen.

First, the mechanical button apparatus according to embodiments of the described technology will be described in detail with reference to FIGS. 3 to 5.

Figure 3:
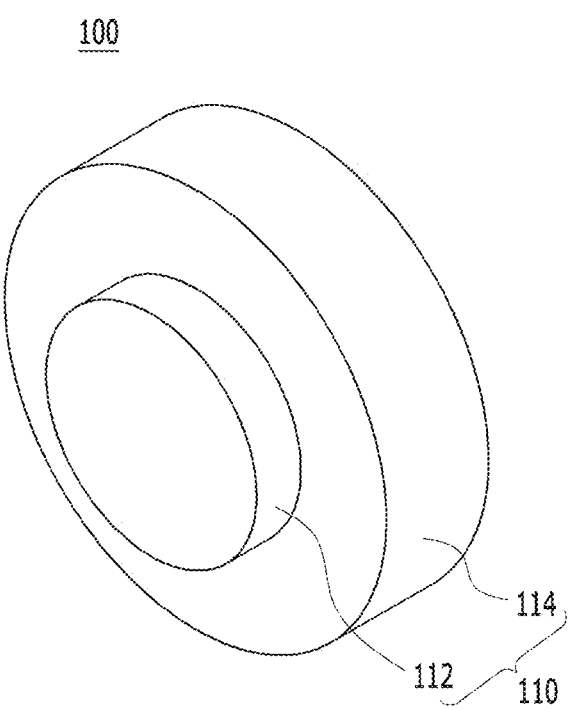
FIG. 3 is a perspective view illustrating an appearance shape of a mechanical button apparatus according to an embodiment of the described technology.

FIG. 3 is a perspective view illustrating an appearance shape of a mechanical button apparatus 100 according to an embodiment of the described technology. FIG. 4 is a side view as the appearance shape of the mechanical button apparatus 100 illustrated in FIG. 3 is seen from a side surface. FIG. 5 is an exploded perspective view of the mechanical button apparatus 100 illustrated in FIGS. 3 and 4.

Figure 4:
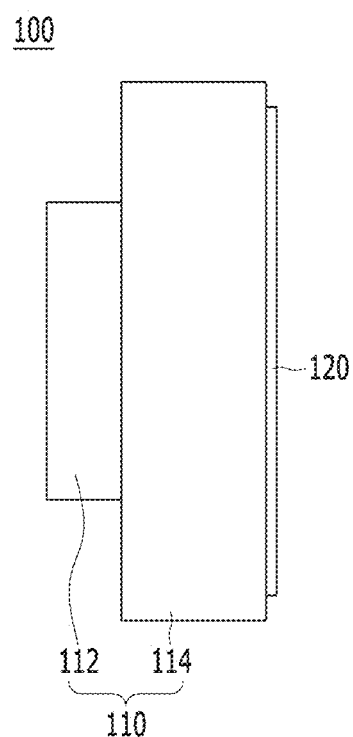
FIG. 4 is a side view as the appearance shape of the mechanical button apparatus illustrated in FIG. 3 is seen from aside surface.
Figure 5:
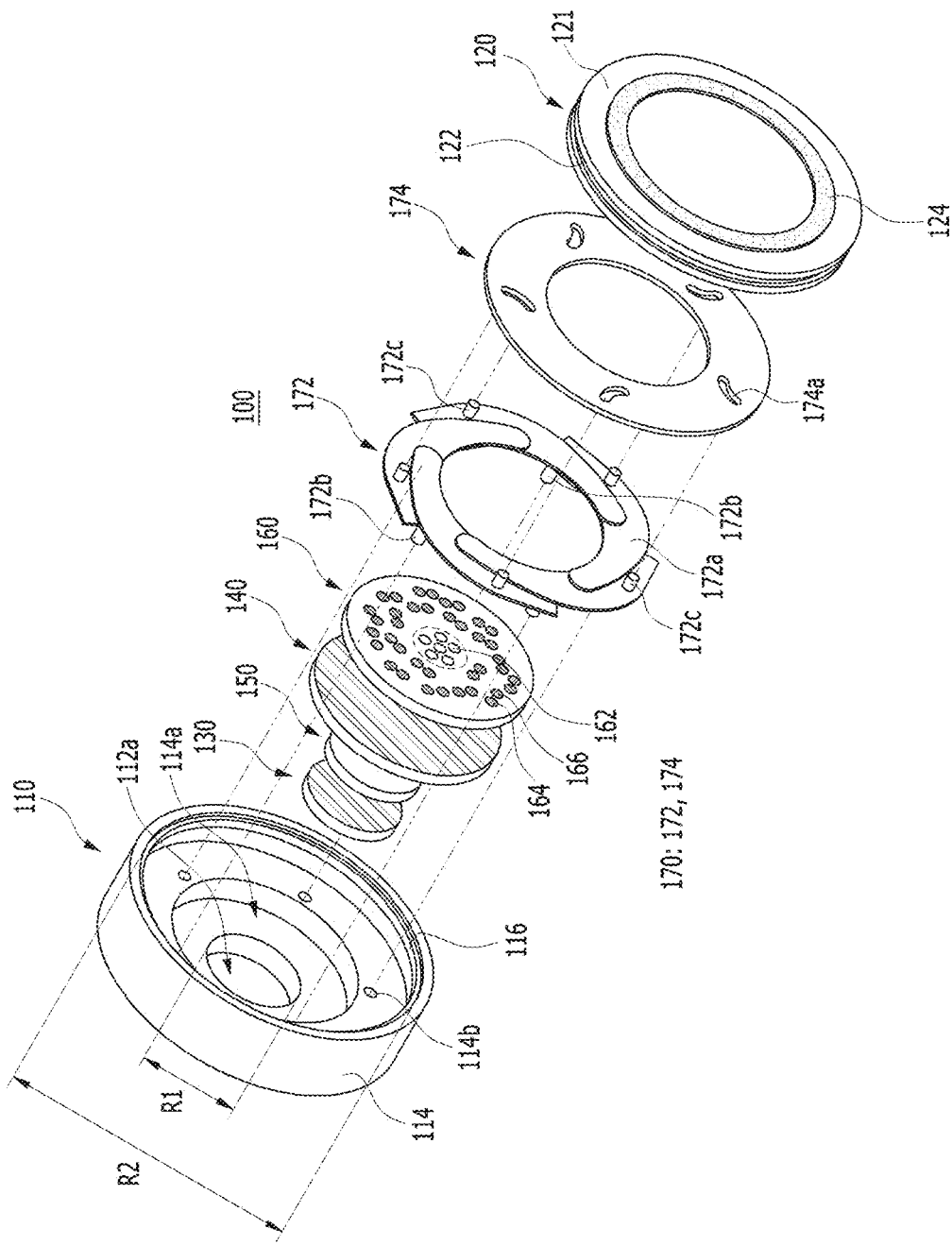
FIG. 5 is an exploded perspective view of the mechanical button apparatus illustrated in FIGS. 3 and 4.

Referring to FIGS. 3 to 5, the mechanical button apparatus 100 according to an embodiment of the described technology may include a body 110 having a cylindrical shape, where fin upper portion thereof is closed and a lower portion thereof is opened, and a bottom plate 120 having a circular plate shape, which covers the lower portion of the body 110.

The body 110, as illustrated in FIGS. 3 and 4, may include a first body 112 and a second body 114, which are implemented as one body.

The first body 112 may have a cylindrical shape having a first internal diameter R1.

The second body 114 may be provided (molded) under the first body 112 and may have a cylindrical shape having a second internal diameter R2 which is greater than the first internal diameter R1. Accordingly, an inner space of the first body 112 may be formed to be less than an inner space of the second body 114.

The bottom plate 120, as illustrated in FIGS. 4 and 5, may cover the open lower portion of the second body 114. The bottom plate 120 may include a transparent material. On the other hand, the body 110 may include an opaque material.

All of the body 110 and the bottom plate 120 may include a plastic material, and for example, the body 110 may include an opaque plastic material and the bottom plate 120 may include a transparent plastic material.

The reason that the bottom plate 120 includes a transparent plastic material is for irradiating light (or display light), emitted from a display screen of a display apparatus, onto a photovoltaic (PV) cell array substrate 160 accommodated into the inner space of the body 110.

A double-sided tape (124 of FIG. 5) may be attached on a bottom surface (121 of FIG. 5) of the bottom plate 120 and the bottom plate 120 may be attached on the display screen of the display apparatus. Therefore, the mechanical button apparatus 100 according to an embodiment of the described technology may be attached on the display screen of the display apparatus 200.

The double-sided tape (124 of FIG. 5), as illustrated in FIG. 5, may be configured in a circular band shape so as not to hinder the light (or the display light) which is emitted from the display screen and is irradiated onto the PV cell array substrate 160.

In a case where the bottom plate 120 is implemented in another shape (for example, a tetragonal plate shape) instead of a circular plate shape, the double-sided tape (124 of FIG. 5) may be configured in a tetragonal band shape. Accordingly, a band shape of the double-sided tape (124 of FIG. 5) may be variously modified based on a plate shape of the bottom plate 120.

A groove (122 of FIG. 5) may be formed (molded) in a side surface of the bottom plate 120 along the side surface thereof.

A protrusion portion 116, which is formed (molded) on an inner surface of the second body 114 to protrude in a circular band shape, may be inserted into the groove (122 of FIG. 5). In this case, the protrusion portion 116 may move along the groove (122 of FIG. 5). Therefore, in a state where the bottom plate 120 is fixed to the display screen by the double-sided tape 124, the body 110 may be configured to rotate along the groove 122 formed in the side surface of the bottom plate 120. This may denote that a user (or a driver) is capable of manipulating a rotation of the mechanical button apparatus 100 through the display screen.

As illustrated in FIG. 5, a first magnetic field sensor 130, a second magnetic field sensor 140, a circuit substrate 150, the PV cell array substrate 160, and an aperture member 170 may be accommodated into a closed inner space formed by coupling (assembly) of the body 110 and the bottom plate 120.

The first magnetic field sensor 130 may be a sensor which generates a magnetic field and may be accommodated into an inner space 112a of the first body 112.

The first magnetic field sensor 130 may have a circular plate shape having a diameter r1 which is less than or equal to the first internal diameter R1, so that the first magnetic field sensor 130 is accommodated into the inner space 112a of the first body 112.

The first magnetic field sensor 130 may primarily sense the approach or not of a finger of a user. For example, the first magnetic field sensor 130 may convert a variation of a magnetic field, which is based on the approach of the finger of the user (a driver or a passenger), into a first electrical signal and may output a result, obtained by sensing the approach of the finger of the user, as the first electrical signal.

The second magnetic field sensor 140 may be accommodated into the inner space 114a of the second body 114 and may have a circular plate shape having a diameter r2 which is less than or equal to the second internal diameter R2, so that the second magnetic field sensor 140 is accommodated into the inner space 114a of the second body 114.

The second magnetic field sensor 140 may secondarily sense the contact or not of the finger of the user. For example, the second magnetic field sensor 140 may convert a variation of the magnetic field, which is based on that the finger of the user (a driver or a passenger) contacts the first body 112 or the second body 114, into a second electrical signal and may output a result, obtained by sensing the contact of the finger of the user, as the second electrical signal.

In terms of a characteristic of a magnetic field sensor, a button size and a sensing sensitivity may be proportional to each other, and as a button size decreases, a directly contact may be needed. The applicant, as shown in the following Table 1, has defined a sensing sensitivity with respect to a button size on the basis of a plurality of experiment results.

TABLE 1

| Shape of magnetic field sensor | Circle (radius: k) | Square (L: length of one side) | Rectangle (a: widthwise length, b: lengthwise length) |
| --- | --- | --- | --- |
| Recognition-enabled distance (D) | $D = 2 \times k$ | $D = L$ | $D = (a + b)/2$ |

In Table 1, the recognition-enabled distance D may denote a sensing sensitivity and may have a characteristic which is proportional to a button size. When the number of manipulations of a user should be large or manipulation should be easy, a magnetic field sensor (particularly, the first magnetic field sensor 130 for sensing the approach or not of a finger instead of a direct contact) may have a size which is determined based on Table 1.

The circuit substrate 150 may be disposed between the first and second magnetic field sensors 130 and 140 and may be accommodated into the inner space 112a of the first body 112.

The circuit substrate 150 may be a substrate having a circular plate shape, which has a diameter almost equal to the diameter r1 of the first magnetic field sensor 130 so as to be accommodated into the inner space of the first body 112.

The circuit substrate 150 may be, for example, a printed circuit board (PCB).

A plurality of modules implemented as a chip type may be mounted on the circuit substrate 150.

The plurality of modules may be electrically connected to a signal wiring patterned on the circuit substrate 150. The plurality of modules mounted on the circuit substrate 150 will be described below in detail with reference to FIGS. 6A and 6B.

The PV cell array substrate 160 may be disposed between the second magnetic field sensor 140 and the bottom plate 120 and may generate an auxiliary power (a voltage and a current) for driving some modules mounted on the circuit substrate 150 by using the display light passing through the bottom plate 120 including a transparent material.

Although described below, the auxiliary power may be used to charge a batters (156 of FIG. 7), or may be directly supplied to some modules (for example, a control unit 151 and a sensor processing unit 152.

In order to generate the auxiliary power, a plurality of PV cells 162 for converting the display light (light energy) into power may be provided on a bottom surface of the PV cell array substrate 160.

The bottom surface of the PV cell array substrate 160 may be disposed to face the display screen with the bottom plate 120 including a transparent material therebetween, and thus, the display light (the light energy) emitted from the display screen may be irradiated onto the plurality of PV cells 162.

Power generated by each of the plurality of PV cells 162 may directly drive some of the plurality of modules mounted on the circuit substrate 150, or may be used as the auxiliary power for charging the battery 156.

For example, when the power generated by each of the plurality of PV cells 162 is sufficient, the power may be used as a main power for directly driving all of the plurality of modules mounted on the circuit substrate 150.

In addition to the plurality of PV cells 162, an optical sensor may be further provided on the bottom surface of the PV cell array substrate 160, and the optical sensor may be used as a sensor for measuring the number of rotation manipulations of the mechanical button apparatus 100 (or the body 110) according to an embodiment of the described technology.

The optical sensor may include a plurality of device pairs, and the plurality of device pairs may be disposed on the bottom surface of the PV cell array substrate 160 to surround the plurality of PV cells 162. Each of the device pairs may include a light emitting device 164 and a light receiving device 166.

The light emitting device 164 and the light receiving device 166 may be disposed adjacent to each other to configure one device pair.

The light emitting device 164 may convert an electrical signal into a light signal, and the light receiving device 166 may receive the light signal and may convert the received light signal into the electrical signal. The light emitting device 164 may be referred to as an electro-optic device, and the light receiving device 166 may be referred to as an opto-electric device.

The number of rotation manipulations of the mechanical button apparatus 100 (or the body 110) may be determined based on the number of electrical signals which are output by a plurality of light receiving devices 166 in response to light signals of a plurality of light emitting devices 164 reflected by the aperture member 170 which will be described below.

The aperture member 170 may be opened or narrowed, and thus, may adjust the number of light receiving devices for receiving a light signal from the light emitting device on tire basis of a size of a hole thereof.

The aperture member 170 may be disposed between the PV cell array substrate 160 and the bottom plate 120. The aperture member 170 may include a wing set 172 and a circular cam plate 174.

The wing set 172 may include a plurality of wings 172a which are disposed circularly between the PV cell array substrate 160 and the circular cam plate 174. In FIG. 5, five wings 172a are illustrated.

A center protrusion portion 172b may be formed (molded) on one surface of each of the plurality of wings 172a.

The center protrusion portion 172b may be inserted into and fixed to a protrusion groove 114b which is formed in an inner surface of the body 110 (the second body 114).

A sliding protrusion portion 172c may be formed on one other surface of each wing 172a.

The camp plate 174 may be disposed between the wing set 172 and the bottom plate 120 and may be fixed to the bottom plate 120.

Five sliding grooves 174a having a rectangular shape may be formed in the cam plate 174. The sliding protrusion portion 172c of the wing 172a may be movably inserted into each sliding groove 174a.

The operating principle of the aperture member 170 may be similar to the operating principle of an aperture of a camera.

For example, when a user rotates the body 110 clockwise or counterclockwise by using a finger, the wing set 172 may rotate based on a rotation direction. At this time, the sliding protrusion portion 172c of each wing 172a may move along the sliding groove 174a of the cam plate 174, and thus, each wing 172a may be expanded outward or contracted inward with respect to a center of a circle.

As each wing 172a is expanded or contracted, a size of a hole formed by the wing set 172 may be expanded and contracted.

Based on the expansion and contraction of the size of the hole, the number of light receiving devices for receiving light signals of the light emitting devices may be adjusted. This will be described below in detail with reference to FIGS. 6A and 6B.

Figure 6A:
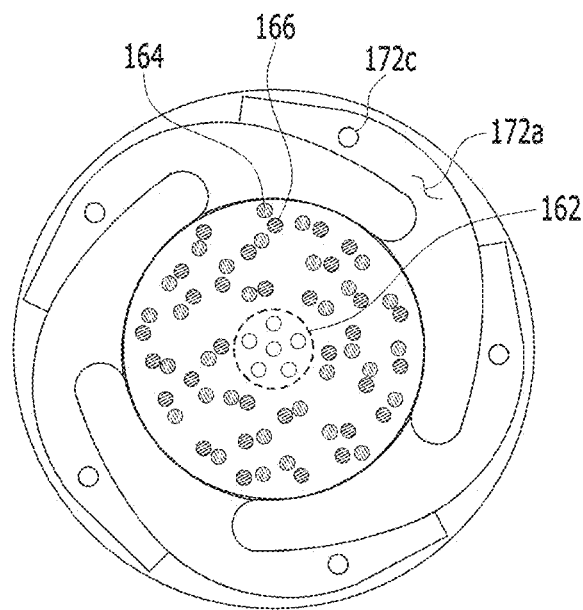
FIGS. 6A and 6B are diagrams for describing the measurement principle of measuring the number of rotation manipulations of a mechanical button apparatus by using an optical sensor and an aperture member illustrated in FIG. 5.
Figure 6B:
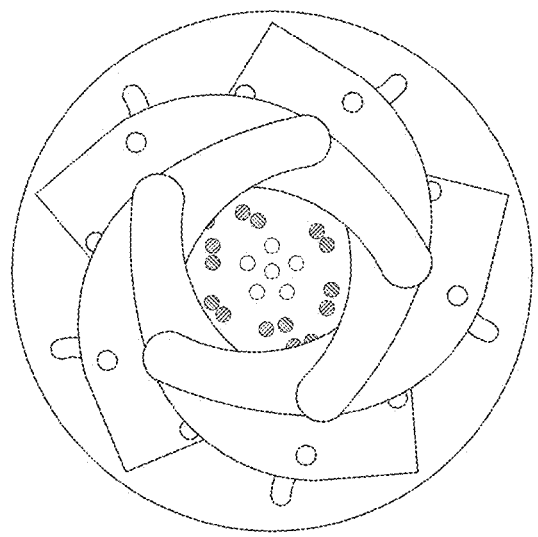

FIGS. 6A and 6B are diagrams for describing the measurement principle of measuring the number of rotation manipulations of a mechanical button apparatus by using an optical sensor and an aperture member illustrated in FIG. 5.

FIG. 6A illustrates positions of the wings 172a expanded based on a rotation of the body 110 in one direction, and FIG. 6B illustrates positions of the wings 172a contracted based on a rotation of the body 110 in other direction.

As in FIG. 6A, when the wings 172a are expanded based on a rotation of the body 110 in one direction, the number of device pairs including the light emitting device 164 and the light receiving device 166 covered by the wing 172a may decrease. Therefore, the number of light signals of the light emitting devices 164 reflected by the wings 172a may be reduced, and thus, the number of light receiving devices 166 receiving the light signals of the light emitting devices 164 may decrease. This may denote that the number of electrical signals obtained front the light receiving devices 166 decreases.

As in FIG. 6B, when the wings 172a are contracted based on a rotation of the body 110 in other direction, the number of device pairs including the light emitting device 164 and the light receiving device 166 covered by the wing 172a may increase. Therefore, the number of light signals of the light emitting devices 164 reflected by the wings 172a may increase, and thus, the number of light receiving devices 166 receiving the light signals of the light emitting devices 164 may increase. This may denote that the number of electrical signals obtained from the light receiving devices 166 increases.

As described above, the wings 172a may be configured to act as a reflective plate which reflects the light signal of the light emitting device 164 to transfer the light signal to the light receiving device, and as the wings 172a are expanded and contracted, the number of rotation manipulations of the body 110 may be calculated by counting the number of electrical signals obtained from the light receiving devices 166.

Hereinafter, a plurality of modules mounted on the circuit substrate 150 will be described in detail with reference to FIG. 7.

Figure 7:
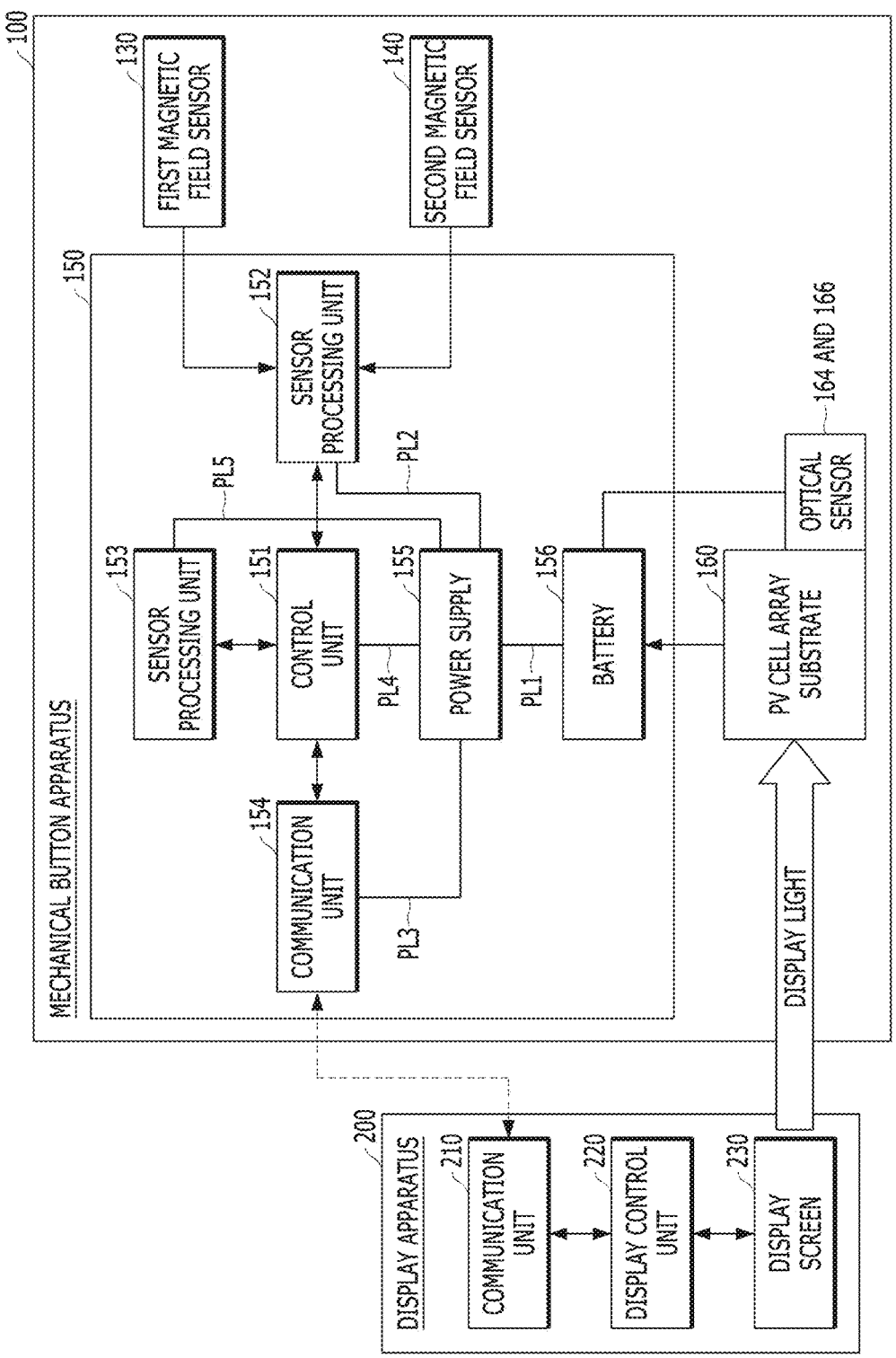
FIG. 7 is a total block diagram of an apparatus for controlling a mechanical button according to an embodiment of the described technology.

FIG. 7 is a block diagram illustrating a plurality of modules mounted on the circuit substrate illustrated in FIG. 5.

Referring to FIG. 7, the plurality modules mounted on the circuit substrate 150 may perform data processing to transmit the number of rotation manipulations of the body 110 (see FIGS. 3 to 5) to the display apparatus 200 through wireless communication, so as to cooperate with a screen which is to be displayed on the display screen.

To this end, the plurality of modules may include a control unit 151, two sensor processing units 152 and 153, a communication unit 154, and a power supply 155, and moreover, may further include a battery 156 which supplies power to the elements.

The control unit 151 may be an element which controls driving of the mechanical button apparatus (or the other modules 152 to 156) according to an embodiment of the described technology. The control unit 151 may process data (intermediate data and result data) output from each of the elements and may simultaneously transfer processed data to other elements. The control unit 151 may be implemented as at least one processor.

The sensor processing unit 152 may process signals obtained from the magnetic field sensors 130 and 140.

The sensor processing unit 152 may convert an analog first electrical signal, input from the first magnetic field sensor 130, into digital first sensing data capable of being processed by the control unit 151. Here, the first electrical signal may be a signal corresponding to a variation of a magnetic field based on the approach of a finger of a user (a driver or a passenger).

The first sensing data may be used as a signal for checking whether the linger of the user approaches the mechanical button apparatus 100 (for example, the beds 110). When it is checked that the first sensing data is generated, the mechanical button apparatus 100 may be changed from a sleep state to a wakeup state (a wakeup mode). In the wakeup state (the wakeup mode), power may be supplied to only some of the plurality of modules mounted on the circuit substrate 150.

Moreover, the sensor processing unit 152 may convert an analog second electrical signal, input from the second magnetic field sensor 140, into digital second sensing data capable of being processed by the control unit 151. Here, the second electrical signal may be a signal corresponding to a variation of a magnetic field based on a contact (a physical contact or a direct contact) of the finger of the user (a driver or a passenger).

The second sensing data may be as a signal for checking whether the finger of the user contacts the mechanical button apparatus 100, and for example, may be used as a signal for checking whether the user actually manipulates the mechanical button apparatus 100.

When it is checked that the second sensing data is generated, the mechanical button apparatus 100 may be changed from the wakeup state (the wakeup mode) to a real operation state (or a real operation mode). The real operation state (or the real operation mode) may denote that all modules mounted on the circuit substrate 150 are supplied with power and are woken up.

As described above, an operation of determining the wakeup state (the wakeup mode) and the rear operation state (the real operation mode) of the mechanical button apparatus 100 on the basis of the generating of the first or second sensing data may be for efficiently using power charged into the battery 156 on the basis of a state.

In a case where the finger of the user contacts the mechanical button apparatus 100 despite that the user does not desire to manipulate the mechanical button apparatus 100 in terms of a characteristic of a magnetic field sensor, an error where the mechanical button apparatus 100 actually operates may be reduced, and moreover, the power consumption of the mechanical button apparatus 100 caused by the actual operation (for example, a case where power is supplied to all modules) may be reduced.

The sensor processing unit 153 may process an electrical signal obtained from an optical sensor (for example, the light emitting device 164 and the light receiving device 166) included in the PV cell array substrate.

The sensor processing unit 153 may receive electrical signals from a plurality of light receiving devices 166 receiving light signals reflected by a wing set (172 of FIG. 5) which is expanded and contracted based on a rotation of the body 110 and may convert the electrical signals into digital signals capable of being processed by the control unit 151.

The control unit 151 may count the number of digital signals input from the sensor processing unit 153 to calculate the number of rotation manipulations of the body 110. For example, the control unit 151 may calculate the number of rotation manipulations corresponding to the number of digital signals currently input from the sensor processing unit 153 with reference to a table where a mapping relationship between the number of digital signals and the number of rotation manipulations is previously defined.

The communication unit 154 may perform wireless communication with the display apparatus 200 to enable cooperation between the mechanical button apparatus 100 and a UI which is to be displayed on the display screen of the display apparatus 200, based on control by the control unit 151. The wireless communication may be near-field wireless communication, and for example, may be Bluetooth communication or WiFi communication.

In the Bluetooth communication, the communication unit 154 may support a Bluetooth pairing function for cooperation with the display apparatus 200. For example, when a plurality of mechanical button apparatuses 100 are attached on the display screen of the display apparatus 200, the display apparatus 200 and the plurality of mechanical button apparatuses 100 may configure a network based on Bluetooth multi-pairing. Accordingly, various buttons may be simultaneously implemented on the display screen.

The communication unit 154 may be configured to have a modulation function, a demodulation function, a filter function, an amplification function, and a frequency conversion function, for supporting wireless communication.

Based on control by the control unit 151, the communication unit 154 may modulate the number of rotation manipulations of the body 110, calculated by the control unit 151, into a wireless communication signal according to a wireless communication protocol (for example, a Bluetooth communication protocol) and may transmit the wireless communication signal to the display apparatus 200.

The communication unit 210 of the display apparatus 200 may demodulate the wireless communication signal received from the communication unit 154 of the mechanical button apparatus 100 to obtain the number of rotation manipulations of the body 110 and may display a screen configuration, corresponding to the obtained number of rotation manipulations of the body 110, on the display screen 230.

Therefore, the mechanical button apparatus 100 may cooperate with a UI which is to be displayed on the display screen.

The power supply 155 may selectively supply the control unit 151, the sensor processing units 152 and 153, and the communication unit 154 with the power charged into the battery 156 on the basis of primary sensing by the first magnetic field sensor 130 and secondary sensing by the second magnetic field sensor 140.

First, the power supply 155 may be connected to the batten 156 by a first power supply line PL1 and may be supplied with the power charged into the battery 156.

Moreover, the power supply 155 may be connected to the sensor processing unit 152 for the magnetic field sensors 130 and 140 by using a second power supply line PL2, connected to the communication unit 154 by a third power supply line PL3, connected to the control unit 151 by a fourth power supply line PL4, and connected to the sensor processing unit 153 for an optical sensor by using a fifth power supply line PL5.

When the user attaches the mechanical button apparatus 100 on the display screen 230 and then turns on (ON) an arbitrary operation switch (not shown) included in the mechanical button apparatus 100, the power supply 155 may preferentially supply the power, charged into the battery 156, to the control unit 151 and the sensor processing unit 152 for the magnetic field sensors 130 and 140. Accordingly, the control unit 151 and the sensor processing unit 152 for the magnetic field sensors 130 and 140 may be first woken up.

The woken-up control unit 151 may primarily check the approach of the finger of the user by using the first magnetic field sensor 130 on the basis of the first sensing data input from the woken-up sensor processing unit 152.

When the approach of the finger of the user is checked, the power supply 155 may supply the communication unit 154 with the power charged into the battery 156 on the basis of control by the control unit 151. Accordingly, the communication unit 151 may be woken up.

The woken-up control unit 151 may secondarily check a contact of the finger of the user by using the second magnetic field sensor 140 on the basis of the second sensing data input from the woken-up sensor processing unit 152.

When the contact of the finger of the user is checked, the power supply 155 may supply the power charged into the battery 156 to the optical sensors 164 and 166 and the sensor processing unit 153 for the optical sensors 164 and 166 on the basis of control by the control unit 151, and thus, the power may be supplied to all modules.

As described above, the control unit 151 may perform control so that the power is supplied to only some modules until before a physical contact of the user is checked by the second magnetic field sensor 140, and thus, the power consumption of the battery 156 may be reduced.

The battery 156 may be attached/detached on/from the circuit substrate 150 and may be a chargeable battery. In this case, the battery 156 may be charged with power generated by the PV cell array substrate 160, and thus, the power consumption of the battery 156 may be more reduced.

When the battery 156 is a disposable battery incapable of charging, the PV cell array substrate 160 may be used to directly supply power to the sensor processing unit 152 for the magnetic field sensors 130 and 140, and the power charged into the battery 156 may be supplied to the other modules 151, 153, and 154.

When power generated by the PV cell array substrate 160 is sufficient and stable, the number of modules supplied with the power may increase.

The PV cell arras substrate 160 may generate the power by using display light emitted from the display screen, instead of sunlight.

Because the display light differs from sunlight in terms of light characteristic, the PV cell array substrate 160 may be difficult to generate a stable power equal to sunlight.

Therefore, in order to generate a stable power from the display light, a display control unit 220 of the display apparatus 200 may control the display screen so that a region with the mechanical button apparatus 100 attached thereon is represented in white.

When the display light is implemented as white light, the applicant has confirmed that a plurality of PV cells 160 generate highest power, based on various experiments.

The display apparatus 100 may cooperate with the mechanical button apparatus 100, without adding a new hardware module. Therefore, the display apparatus 200 may include only the display control unit 220 (a graphics processing unit (GPU)) and a display screen 230 (a display panel).

In FIG. 7, it is illustrated that the display apparatus 200 further includes an element such as the communication unit 210, but this is merely for clarifying an operation of performing wireless communication with the mechanical button apparatus 100 and it is not required that the display apparatus 200 is designed to necessarily include the communication unit 210.

When the display apparatus 200 does not include the communication unit 210, the communication unit 210 may be replaced with a communication device (for example, an arbitrary device for supporting Bluetooth communication) fundamentally equipped in a vehicle, and the arbitrary device may be connected to the display apparatus 200 through CAN or LIN communication, whereby wireless communication between the display apparatus 200 and the mechanical button apparatus 100 may be performed. Accordingly, it is not required that new hardware for cooperating with the mechanical button apparatus 100 is added to the display apparatus 200.

Moreover, it is described that the display control unit 220 controls the display screen 230 so that a region with the mechanical button apparatus 100 attached thereon is represented by white display light on the display screen 230. However, this may be implemented by simply changing and updating software executed by the display control unit 220 without adding specific hardware, and may not denote that it is needed to add a new hardware element.

Hereinafter, a method of controlling a mechanical button according to an embodiment of the described technology will be described in detail with reference to FIG. 8.

Figure 8:
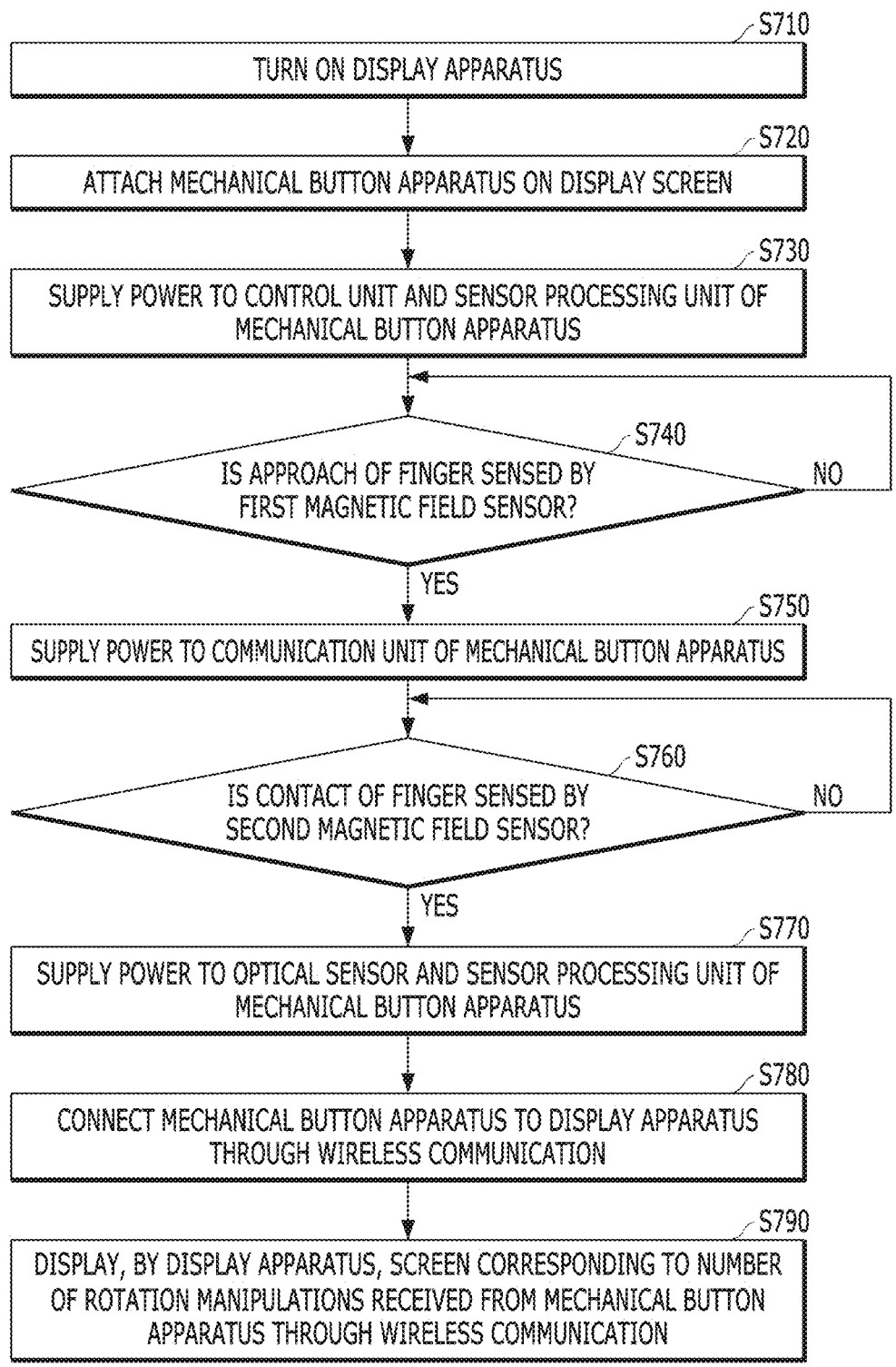
FIG. 8 is a flowchart illustrating a method of controlling a mechanical button according to an embodiment of the described technology.

FIG. 8 is a flowchart illustrating a method of controlling a mechanical button according to an embodiment of the described technology.

Referring to FIG. 8, first, in step S710, the display apparatus 200 installed in a vehicle may be turned on (ON).

Subsequently, in step S720, a user (a driver or a passenger) may attach the mechanical button apparatus 100 on a predetermined position of the display screen 230. Subsequently, based on manipulation of the user, the display control unit 220 may convert a region, on which the mechanical button apparatus 100 is attached, into a white screen. This may be for that the PV cell array substrate 160 of the mechanical button apparatus 100 generates a stable power from white display light.

Subsequently, in step S730, the user may turn on the mechanical button apparatus 100, and then, the power supply 155 may preferentially supply power to the control unit 151 and the sensor processing unit 152 for a magnetic field sensor. Accordingly, the control unit 151 and the sensor processing unit 152 for the magnetic field sensors 164 and 166 may be woken up.

Subsequently, in step S740, the first magnetic field sensor 130 may sense whether a finger of the user approaches the mechanical button apparatus 100.

Subsequently, in step S750, when the control unit 151 checks the approach of the finger of the user on the basis of a sensing result of the first magnetic field sensor 130, the power supply 155 may supply a power of a battery to the communication unit 154 on the basis of control by the control unit 151. Accordingly, the communication unit 154 may be woken up.

Subsequently, in step S760, the second magnetic field sensor 140 may secondarily sense whether the finger of the user contacts the mechanical button apparatus 100.

Subsequently, in step S770, when the control unit 151 checks the contact of the finger of the user on the basis of a sensing result of the second magnetic field sensor 140, the power supply 155 may supply the power of the battery to the optical sensors 164 and 166 and the sensor processing unit 153 for the optical sensors on the basis of control by the control unit 151.

Subsequently, in step S780, a series of communication process (a Bluetooth pairing process) for a wireless communication connection between the communication unit 154 of the mechanical button apparatus 100 and the communication unit 210 of the display apparatus 200 may be performed.

Subsequently, in step S790, when a wireless communication channel between the mechanical button apparatus 100 and the display apparatus 200 is formed, the user may start the rotation manipulation of the mechanical button apparatus 100, the optical sensors 164 and 166 may sense the number of rotation manipulations of the body 110 based on the rotation manipulation of the user and may transfer sensing data (electrical signals output from light receiving devices receiving light signals from light emitting devices), corresponding to the number of rotation manipulations, to the control unit 151. The control unit 151 may transfer the sensing data, corresponding to the number of rotation manipulations, to the display apparatus 200 through the communication unit 154.

Therefore, the display control unit 220 of the display apparatus 200 may control the display screen 230 to display a screen corresponding to the number of rotation manipulations and is received through the communication unit 154.

The described technology may propose a mechanical button which is attachable on a display screen of a display apparatus and cooperates with the display apparatus through a UI with being attached thereon. Accordingly, when a mechanical button is changed, a corresponding display apparatus may not be manufactured again.

Moreover, the mechanical button attached on a display apparatus according to the described technology may sense the manipulation or not of a user, and when there is no user manipulation, the mechanical button may be driven with a low power, thereby decreasing power consumption.

Moreover, the mechanical button attached on a display apparatus according to the described technology may operate in a photovoltaic charging mode, and thus, power may be continuously supplied thereto by using a characteristic of a display emitting light.

The described technology may be implemented with a hardware element, a software element, and/or a combination thereof. For example, the devices and the elements described above in the embodiments may be implemented by using one or more general-use computers or special-purpose computers, like a processor, a controller, an arithmetic logic unit (ALU), a digital signal processor, a microcomputer, field programmable gate array (FPGA), programmable logic unit (PLU), a microprocessor, or an arbitrary device capable of executing an instruction and responding thereto.

Software may include a computer program, a code, an instruction, or a combination of one or more thereof and may configure a processing device to perform a desired operation or to issue a command to the processing device independently or collectively. Software and/or data may be permanently or temporarily embodied in an arbitrary type machine, a component, physical equipment, virtual equipment, a computer storage medium or device, or a transmitted signal wave, so as to be construed by a processing device or to provide an instruction or data. Software may be distributed to computer systems connected to one another over a network and may be stored or executed based on a distributed method. Software and data may be stored in one or more computer-readable recording medium.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A mechanical button apparatus comprising:
   a body including a closed upper portion and an opened lower portion; and
   a bottom plate configured to be attached on a display screen of a display apparatus to cover the opened lower portion of the body,
   wherein the body further comprises:
   an aperture member including a wing set configured to be expanded or contracted in a rotational direction of the body;
   a photovoltaic (PV) cell array substrate including a PV cell configured to generate power for charging a battery and an optical sensor configured to convert light signals, reflected by the expanded or contracted wing set, into electrical signals; and
   a circuit substrate configured to operate with the power charged into the battery, calculate number of rotation manipulations of the body by using the electrical signals, and transmit the calculated number of rotation manipulations to the display apparatus.

2. The mechanical button apparatus of claim 1, wherein the bottom plate is configured to be attached on the display screen by a double-sided tape.

3. The mechanical button apparatus of claim 1, wherein the aperture member further comprises a cam plate, and wherein the wing set comprises a plurality of wings arranged in a circularly shape, the mechanical button apparatus further comprising:
   a center protrusion portion formed on one surface of each of the plurality of wings, wherein the center protrusion portion is inserted into and fixed to a protrusion groove formed in an inner surface of the body; and
   a sliding protrusion portion formed on one oilier surface of each wing and movably inserted into a sliding groove formed in the cam plate.

4. The mechanical button apparatus of claim 3, wherein, based on a rotation of the body, the sliding protrusion portion of each wing is configured to move along the sliding groove such that each wing is expanded outward or contracted inward with respect to a center of the circular shape.

5. The mechanical button apparatus of claim 1, wherein the optical sensor comprises:
   a plurality of light emitting devices configured to output the light signals; and
   a plurality of light receiving devices configured to receive the light signals reflected by the wing set and to convert the light signals into the electrical signals.

6. The mechanical button apparatus of claim 5, further comprising a control unit mounted on the circuit substrate and configured to calculate the number of rotation manipulations of the body on the basis of the number of electrical signals obtained through the conversion by the light receiving devices.

7. A mechanical button apparatus comprising:
   a body including a closed upper portion and an opened lower portion, and
   a bottom plate configured to be attached on a display screen of a display apparatus to cover the opened lower portion of the body,
   wherein the body comprises:
   an aperture member including a wing set configured to be expanded or contracted in a rotational direction of the body;
   a photovoltaic (PV) cell array substrate including a PV cell configured to generate power for charging a battery and an optical sensor configured to convert light signals, reflected by the expanded or contracted wing set into electrical signals;
   a magnetic field sensor configured to sense approach or contact of a finger of a user; and
   a circuit substrate including a plurality of modules configured to calculate number of rotation manipulations of the body by using the electrical signals and to perform data processing for transmitting the calculated number of rotation manipulations to the display apparatus and a power supply configured to, when the approach of the finger is sensed, supply some of the plurality of modules with the power charged into the battery and when the contact of the finger is sensed, supply the other modules with the power charged into the battery.

8. The mechanical button apparatus of claim 7, wherein the magnetic field sensor comprises:
   a first magnetic field sensor configured to sense the approach of the finger; and
   a second magnetic field sensor configured to sense the contact of the finger.

* * * * *